(12) United States Patent
Pei et al.

(10) Patent No.: US 10,312,176 B2
(45) Date of Patent: Jun. 4, 2019

(54) SEMICONDUCTOR DEVICE (71) Applicant: Gpower Semiconductor, Inc., Suzhou (CN)

(72) Inventors: Yi Pei, Suzhou (CN); Mengjie Zhou, Suzhou (CN)

(73) Assignee: GPOWER SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 15/478,200

(22) Filed: Apr. 3, 2017

(65) Prior Publication Data
US 2017/0287811 A1 Oct. 5, 2017

(30) Foreign Application Priority Data

Apr. 5, 2016 (CN) .......................... 2016 1 0205793

(51) Int. Cl.
| | |
|---|---|
| *H01L 23/373* | (2006.01) |
| *H01L 29/778* | (2006.01) |
| *H01L 29/78* | (2006.01) |
| *H01L 23/29* | (2006.01) |
| *H01L 29/417* | (2006.01) |
| *H01L 29/20* | (2006.01) |

(52) U.S. Cl.
CPC ........ *H01L 23/3738* (2013.01); *H01L 23/291* (2013.01); *H01L 29/7786* (2013.01); *H01L 29/78* (2013.01); *H01L 29/2003* (2013.01); *H01L 29/4175* (2013.01); *H01L 29/41758* (2013.01)

(58) Field of Classification Search
USPC ........................................................ 257/192
See application file for complete search history.

(56) References Cited

U.S. PATENT DOCUMENTS

| | | | | |
|---|---|---|---|---|
| 8,987,780 | B2 * | 3/2015 | Zhang | H01L 29/66431 257/12 |
| 9,425,301 | B2 * | 8/2016 | Chiu | H01L 23/291 |
| 9,596,788 | B1 * | 3/2017 | Lai | H01L 23/373 |
| 2002/0180062 | A1 * | 12/2002 | Hsieh | H01L 23/4985 257/778 |
| 2004/0124421 | A1 * | 7/2004 | Yamazaki | H01L 51/5012 257/79 |
| 2008/0029761 | A1 * | 2/2008 | Peng | H01L 33/486 257/43 |

(Continued)

*Primary Examiner* — Fazli Erdem
(74) *Attorney, Agent, or Firm* — Flener IP & Business Law; Zareefa B. Flener (57) ABSTRACT

A semiconductor device comprises: a substrate; a multi-layer semiconductor layer located on the substrate, the multi-layer semiconductor layer being divided into an active area and a passive area outside the active area; a gate electrode, a source electrode and a drain electrode all located on the multi-layer semiconductor layer and within the active area; and a heat dissipation layer covering at least one portion of the active area and containing a heat dissipation material. In embodiments of the present invention, a heat dissipation layer covering at least one portion of the active area is provided in the semiconductor device. The arrangement of the heat dissipation layer adds a heat dissipation approach for the semiconductor device in the planar direction, thus the heat dissipation effect of the semiconductor device is improved.

15 Claims, 3 Drawing Sheets

(56) References Cited

U.S. PATENT DOCUMENTS

| | | | | |
|---|---|---|---|---|
| 2008/0054795 A1* | 3/2008 | Ohmi | ............... | H01L 51/5206 313/504 |
| 2009/0078960 A1* | 3/2009 | Wang | ............... | H01L 25/167 257/100 |
| 2010/0099236 A1* | 4/2010 | Kwon | ............... | H01L 21/02112 438/435 |
| 2010/0230722 A1* | 9/2010 | Chang | ............... | H01L 25/072 257/194 |
| 2010/0270559 A1* | 10/2010 | Ota | ............... | H01L 29/7787 257/76 |
| 2011/0210377 A1* | 9/2011 | Haeberlen | ............... | H01L 29/2003 257/194 |
| 2013/0140526 A1* | 6/2013 | Kim | ............... | C01B 21/064 257/29 |
| 2013/0252410 A1* | 9/2013 | Wenxu | ............... | H01L 21/268 438/586 |
| 2014/0239256 A1* | 8/2014 | Kim | ............... | H01L 21/0262 257/29 |
| 2014/0264282 A1* | 9/2014 | Lee | ............... | H01L 29/267 257/29 |
| 2014/0287244 A1* | 9/2014 | Shin | ............... | B32B 15/04 428/446 |
| 2014/0291607 A1* | 10/2014 | Kim | ............... | H01L 29/1606 257/9 |
| 2014/0327012 A1* | 11/2014 | Ougazzaden | ............... | H01L 21/0237 257/76 |
| 2015/0069408 A1* | 3/2015 | Nanjo | ............... | H01L 29/7787 257/76 |
| 2015/0108500 A1* | 4/2015 | Irsigler | ............... | H01L 29/267 257/77 |
| 2015/0287495 A1* | 10/2015 | Lee | ............... | H05K 1/024 428/139 |
| 2015/0294921 A1* | 10/2015 | Viswanathan | ............... | H01L 23/367 257/76 |
| 2015/0364591 A1* | 12/2015 | Lu | ............... | H01L 29/66462 257/194 |
| 2016/0014878 A1* | 1/2016 | Kilhenny | ............... | H01L 23/142 257/99 |
| 2016/0118460 A1* | 4/2016 | Pei | ............... | H01L 29/0673 257/9 |
| 2016/0211431 A1* | 7/2016 | Yang | ............... | H01L 33/641 |
| 2016/0247745 A1* | 8/2016 | Perkins | ............... | H01L 23/3185 |
| 2016/0351684 A1* | 12/2016 | Chiu | ............... | H01L 23/291 |
| 2016/0380090 A1* | 12/2016 | Roberts | ............... | H01L 22/32 257/76 |
| 2017/0054271 A1* | 2/2017 | Muller | ............... | H01S 5/0224 |
| 2017/0148950 A1* | 5/2017 | Dechoux | ............... | H01L 33/18 |
| 2017/0294528 A1* | 10/2017 | Ren | ............... | H01L 29/778 |
| 2018/0254317 A1* | 9/2018 | Pohlman, III | ............... | H01L 28/60 |

* cited by examiner

| Test parameters | Before the formation of the heat dissipation layer | After the formation of the heat dissipation layer | Improvement percentage |
|---|---|---|---|
| Saturated current (mA) | 78.8 | 82.0 | 4.06% |

FIG. 1C

| Test parameters | Before the formation of the heat dissipation layer | After the formation of the heat dissipation layer | Improvement percentage |
|---|---|---|---|
| $f_T$ | 4.88 | 5.49 | 12.5% |
| $f_{max}$ | 19.47 | 20.63 | 5.95% |
| U(4GHz) | 17.59 | 20.04 | 13.9% |
| MSG(4GHz) | 11.00 | 11.25 | 2.27% |

SEMICONDUCTOR DEVICE

CROSS-REFERENCE TO RELATED APPLICATIONS

This application claims the benefit and priority of Chinese patent application No. 201610205793.X filed on Apr. 5, 2016, the entire content of which is incorporated herein by reference.

TECHNICAL FIELD

Embodiments of the present invention relate to semiconductor technology, and in particular to a semiconductor device.

BACKGROUND

Compared with the first-generation semiconductor Si and the second-generation semiconductor GaAs, GaN semiconductor devices are more suitable for the preparation of high-temperature, high-voltage, high-frequency and high-power electronic devices due to their remarkable advantages of large bandgap width, high electron mobility, high breakdown field strength, high-temperature resistance and the like, and thus exhibit great application prospects.

GaN semiconductor devices usually operate in high-power and high-current environments. Due to their operating conditions, a large amount of heat will be generated within active areas of the GaN semiconductor devices, and as a result, the temperatures of the devices rise. The rise in temperature will result in performance degradation or even failure of the GaN semiconductor devices. Thus, usually, the heat dissipation issue should be considered in design of the GaN semiconductor devices. For an existing GaN semiconductor device, heat dissipation is realized mainly by the following approaches: heat in the active area is diffused to a device substrate and then longitudinally transferred to a base having good heat dissipation performance through the device substrate; heat is transversely transferred to the outside of the active area via metal electrode connecting lines and semiconductor material of the device; and heat generated in the GaN semiconductor device is dissipated by air on an upper surface of the GaN semiconductor device.

However, the packaging of the GaN semiconductor devices causes low air flow inside the housing, and thus results in poor heat dissipation effect by air. Since the contact areas between the metal electrode connecting lines and the GaN semiconductor devices are small, no effective heat dissipation is ensured. Accordingly, the heat dissipation performance of the existing GaN semiconductor devices is limited.

SUMMARY

Embodiments of the present invention provide a semiconductor device to solve the problem of poor heat dissipation of semiconductor devices in the prior art.

Embodiments of the present invention disclose a semiconductor device comprising: a substrate; a multi-layer semiconductor layer located on the substrate, the multi-layer semiconductor layer being divided into an active area and a passive area outside the active area; a gate electrode, a source electrode and a drain electrode all located on the multi-layer semiconductor layer and within the active area; and a heat dissipation layer covering at least one portion of the active area and containing a heat dissipation material.

The heat dissipation layer may cover the gate electrode, and may further cover the source electrode and the drain electrode.

The heat dissipation layer may cover the whole active area, and may further extend to the passive area.

The heat dissipation material may comprise boron nitride. For example, the heat dissipation layer may be made of any one of single-layer boron nitride, bilayer boron nitride, multi-layer boron nitride and boron nitride nanosheet.

The semiconductor device may further comprise a first dielectric layer located at a side of the multi-layer semiconductor layer facing the heat dissipation layer, the first dielectric layer being formed at least on the multi-layer semiconductor layer between the gate electrode and the source electrode and between the gate electrode and the drain electrode. The first dielectric layer may further extend to the passive area.

The semiconductor device may further comprise a second dielectric layer which is located between the first dielectric layer and the heat dissipation layer and covers the gate electrode, or a second dielectric layer which is located at a side of the heat dissipation layer away from the first dielectric layer.

The semiconductor device may further comprise a first through hole which is located at a side of the source electrode away from the heat dissipation layer, penetrates through the multi-layer semiconductor layer and the substrate, and is filled with a heat dissipation material. The heat dissipation material filled in the first through hole may comprise boron nitride.

The semiconductor device may further comprise a back metal layer located at a side of the substrate away from the multi-layer semiconductor layer. The first through hole may penetrate through the back metal layer, and the back metal layer may cover a wall of the first through hole.

The semiconductor device may further comprise a source electrode pad located within the passive area and electrically connected to the source electrode; and a second through hole which is located at a side of the source electrode pad away from the heat dissipation layer, penetrates through the multi-layer semiconductor layer and the substrate, and is filled with a heat dissipation material. The heat dissipation material filled in the second through hole may comprise boron nitride.

The multi-layer semiconductor layer may comprise a buffer layer located on the substrate; and a barrier layer located on the buffer layer, wherein the barrier layer and the buffer layer form a heterojunction structure, and the source electrode, the drain electrode and the gate electrode are all located on a surface of the barrier layer.

The multi-layer semiconductor layer may further comprise a nucleation layer located between the substrate and the buffer layer and/or a capping layer located at a side of the barrier layer away from the substrate.

For the semiconductor device provided by embodiments of the present invention, a heat dissipation layer covering at least one portion of the active area is provided in the semiconductor device. The arrangement of the heat dissipation layer can add a heat dissipation approach for the semiconductor device in the planar direction. Accordingly, the dissipation of heat from the heat sources inside the semiconductor device to the outside of the semiconductor device is facilitated, the heat dissipation effect of the semiconductor device is improved, and the temperature inside the semiconductor device is decreased. Thus, the distribution of the heat field inside the semiconductor device becomes more uniform, and the reliability of the semiconductor device is improved.

BRIEF DESCRIPTION OF DRAWINGS

These and other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Figure 1A:
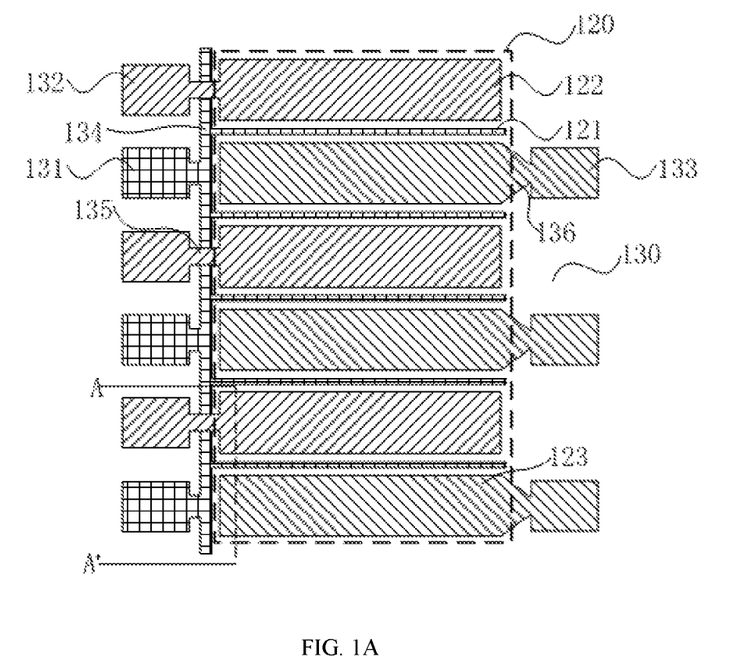
FIG. 1A is a top view of a semiconductor device according to a first embodiment of the present invention.
Figure 1B:
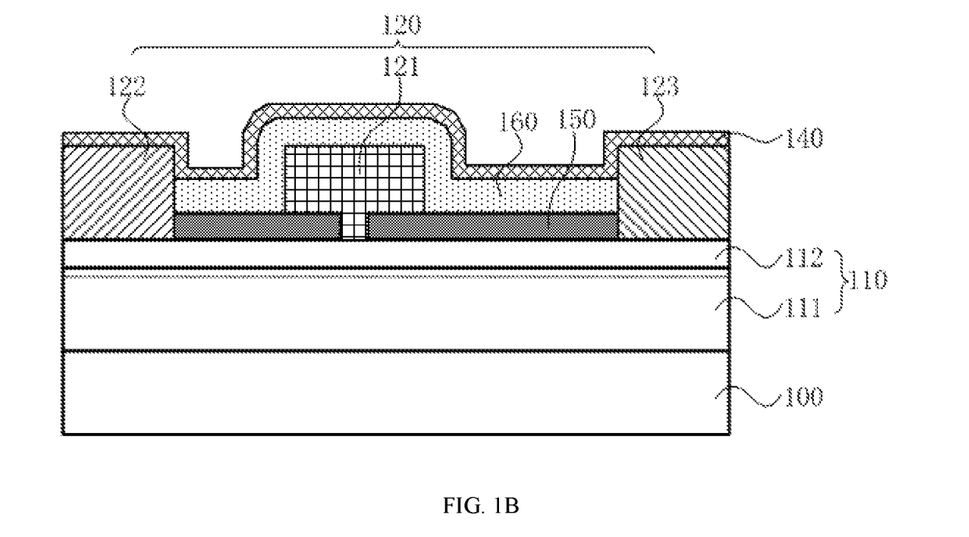
FIG. 1B is partial sectional view of FIG. 1A along A-A'.

FIG. 1A is a top view of a semiconductor device according to a first embodiment of the present invention, and FIG. 1B is partial sectional view of FIG. 1A along A-A'. FIG. 1B shows, in a sectional view, the structure of one transistor shown in FIG. 1A. Referring to FIGS. 1A and 1B, the semiconductor device in this embodiment comprises: a substrate 100; a multi-layer semiconductor layer 110 located on the substrate 100, the multi-layer semiconductor layer 110 being divided into an active area 120 and a passive area 130 outside the active area 120; a gate electrode 121, a source electrode 122 and a drain electrode 123 all located within the active area 120 on the multi-layer semiconductor layer 110; and a heat dissipation layer 140 covering at least one portion of the active area 120 and used for dissipating heat generated in the active area 120.

In this embodiment, as shown in FIG. 1B, the heat dissipation layer 140 covers the whole active area 120 in the transverse direction (up-down direction in FIG. 1A) of the gate electrode 121, that is, covers all of the gate electrode 121, the source electrode 122 and the drain electrode 123. However, the present invention is not limited thereto. The heat dissipation layer 140 can cover only a portion of the active area 12. For example, the heat dissipation layer can cover only the gate electrode 121, without extending to the source electrode 122 and the drain electrode 123.

In addition, in the longitudinal direction (the left-right direction in FIG. 1A) of the gate electrode 121, the heat dissipation layer 140 can cover the entirety of the active area 120, or can cover only a portion of the active area 120.

Alternatively, the heat dissipation layer 140 can also extend to the passive area 130. This is not limited in the present invention.

In this embodiment, the substrate 100 is optionally a SiC substrate. It can be understood by those skilled in the art that the substrate 100 is not limited to the above-mentioned SiC substrate. For example, optionally, the substrate 100 can also be made of sapphire, GaN, Si or other material suitable for the growth of GaN. The substrate 100 is not specifically limited in the present invention. In this embodiment, optionally, the substrate 100 can be formed by Chemical Vapor Deposition (CVD). It can be understood by those skilled in the art that the method for forming the substrate 100 is not limited to the above-mentioned method. For example, metal-organic compound chemical vapor deposition, atomic layer epitaxy or other methods can also be used. The method for forming the substrate 100 is not specifically limited in the present invention.

In this embodiment, the multi-layer semiconductor layer 110 is located on the substrate 100. The multi-layer semiconductor layer 110 is divided into two parts: the active area 120 and the passive area 130 surrounding the active area 120. The gate electrode 121, the source electrode 122 and the drain electrode 123 are located on the multi-layer semiconductor layer 110 and within the active area 120. The source electrode 122 and the drain electrode 123 each form ohmic contact with the multi-layer semiconductor layer 110. In this embodiment, optionally, the multi-layer semiconductor layer 110 is made of a III-V compound semiconductor material. However, the multi-layer semiconductor layer 110 is not specifically limited in the present invention.

In this embodiment, the gate electrode 121 in the active area 120 is located between the source electrode 122 and the drain electrode 123, and the gate electrode 121 is inter-digitally distributed between the source electrode 122 and the drain electrode 123. Optionally, the gate electrode 121 is a single-layer metal gate electrode. The structure of the gate electrode 121 is not specifically limited in the present invention. For example, optionally, the gate electrode 121 is a bilayer metal-stacked gate electrode or a multi-layer gate electrode. In this embodiment, optionally, the gate electrode 121 is a T-shaped gate electrode. The shape of the gate electrode 121 is not specifically limited in the present invention. For example, optionally, the gate electrode 121 can be rectangular or in other shapes.

It is to be noted that, if the gate electrode 121 is a multi-layer gate electrode, during the manufacture of the semiconductor device, a layer of insulating medium (for example, $SiO_2$) is optionally provided between the gate electrode 121 and the multi-layer semiconductor layer 110, so as to form a metal-insulating layer-semiconductor (MIS) structure. In this embodiment, optionally, the source electrode 122 and the drain electrode 123 are made of a metal material. The material of the source electrode 122 and the drain electrode 123 is not specifically limited in the present invention. For example, optionally, the source electrode 122 and the drain electrode 123 can be made of composites of a plurality of metal materials.

In this embodiment, the semiconductor device comprises the active area 120 and the passive area 130. Within the passive area 130, there are gate electrode pads 131, source electrode pads 132 and drain electrode pads 133. The gate structure of the semiconductor device comprises the gate electrode 121 located within the active area 120 and the gate electrode pads 131 located within the passive area 130. The source structure comprises the source electrode 122 located within the active area 120 and the source electrode pads 132 located within the passive area 130. The drain structure comprises the drain electrode 123 located within the active area 120 and the drain electrode pads 133 located within the passive area 130.

Specifically, the gate electrode pads 131 in the passive area 130 are electrically connected to the gate electrode 121 in the active area 120 by a gate electrode interconnect line 134, the source electrode pads 132 in the passive area 130 are electrically connected to the source electrode 122 in the active area 120 by air bridges 135, and the drain electrode pads 133 in the passive area 130 are electrically connected to the drain electrode 123 in the active area 120 by drain electrode interconnection metals 136. The air bridges 135 are disposed above the gate electrode interconnection line 134. However, the specific structure of the semiconductor device in the present invention is not limited thereto.

In this embodiment, the active area 120, as the heat source of the semiconductor device, will generate heat which causes the rise in temperature inside the semiconductor device. It is well known that the existing semiconductor devices are poor in heat dissipation. In this embodiment, in order to improve the heat dissipation efficiency of the semiconductor device, a heat dissipation layer 140 covering at least a portion of the active area 120 of the semiconductor device is provided.

The heat dissipation layer 140 covering at least a portion of the active area 120 can serve as an added heat dissipation approach, by which the heat in the active area 120 of the semiconductor device is dissipated to the passive area 130 and the substrate 100 so that the transfer of the heat inside the semiconductor device in the transverse direction is facilitated. Thus, for the semiconductor device in this embodiment, the heat dissipation layer 140, which is used as an added high-efficiency heat dissipation approach in the planar direction, quickly dissipates the heat generated inside the semiconductor device to the outside of the semiconductor device. The heat dissipation of the semiconductor device is facilitated.

In this embodiment, compared with the prior art, a heat dissipation layer 140 covering at least one portion of the active area 120 is provided in the semiconductor device. The arrangement of the heat dissipation layer 140 can add a heat dissipation approach for the semiconductor device in the planar direction. Accordingly, the dissipation of the heat from the heat sources inside the semiconductor device to the outside of the semiconductor device is facilitated, the heat dissipation effect of the semiconductor device is improved, and the temperature inside the semiconductor device is decreased. Thus, the distribution of the heat field inside the semiconductor device becomes more uniform, and the heat dissipation efficiency and reliability of the semiconductor device are improved.

The heat dissipation layer 140 is preferably made of boron nitride. Boron nitride, as a novel single-atom-layer two-dimensional material, has unique crystal structure and excellent physicochemical characteristics. Due to a high heat conductivity of up to 400 W/(mK), the electrical insulation characteristic, and high reliability of avoiding short-circuits inside the device, boron nitride is one of the insulating materials exhibiting best heat dissipation performance and is suitable for being used as the heat dissipation layer 140 of the semiconductor device provided in this embodiment.

The heat dissipation layer 140 made of boron nitride can be formed by a transfer process. Specifically, boron nitride is grown on the substrate by CVD, then boron nitride grown on the substrate is transferred to the surface of the semiconductor device, and finally the pattern of boron nitride is defined and boron nitride in a portion of the surface of the semiconductor device which does not require the covering of boron nitride is completely etched by oxygen plasma. Alternatively, the heat dissipation layer 140 can be formed by spin-coating. Specifically, boron nitride is dissolved in a suspension liquid and then spin-coated on the surface of the semiconductor device, and finally, boron nitride in a portion of the surface of the semiconductor device which does not require the covering of the boron nitride is completely etched by oxygen plasma.

Boron nitride has a high heat-conductivity. The high heat-conductivity of the heat dissipation layer 14 made of boron nitride in the planar direction adds a heat dissipation approach for the semiconductor device. Accordingly, the dissipation of heat in the semiconductor device from the active area 120 to the passive area 130 is facilitated, the overall heat dissipation effect of the semiconductor device is improved, and the temperature inside the semiconductor device is decreased. Thus, the distribution of the heat field inside the semiconductor device becomes more uniform, and the heat dissipation efficiency and reliability of the semiconductor device are improved.

More preferably, the heat dissipation layer 140 is made of multi-layer boron nitride, because of the following considerations: on one hand, although single-layer boron nitride has a heat conductivity of up to 600 W/(mK) while multi-layer boron nitride and bulky boron nitride have a heat conductivity of only 400 W/(mK), the heat dissipation effectiveness depends upon the overall heat dissipation performance instead of just the heat conductivity of material, and in this regard, multi-layer material apparently exhibits better heat dissipation performance; and on the other hand, it is likely to break the single-layer boron nitride material during the experiments so that the semiconductor device cannot be covered completely. It can be understood by those skilled in the art that, in the present invention, optionally, the heat dissipation layer 14 is made of any one or more of bilayer boron nitride, multi-layer boron nitride or boron nitride nanosheet, or other heat dissipation material. The material of the heat dissipation layer 14 is not specifically limited in the present invention.

Exemplarily, based on the above technical solutions, the semiconductor device further comprises: a first dielectric layer 150 located at a side of the multi-layer semiconductor layer 110 facing the heat dissipation layer 140, the first dielectric layer 150 being formed at least on the multi-layer semiconductor layer 110 between the gate electrode 121 and the source electrode 122 and between the gate electrode 121 and the drain electrode 123.

In this embodiment, optionally, the first dielectric layer 150 is made of SiN. Optionally, the first dielectric layer 150 is formed by MOCVD. However, in the present invention, the material of the first dielectric layer 150 is not limited, and the method for forming the first dielectric layer 150 is not limited either. For example, the first dielectric layer 150 can be formed by PECVD, ALD, MBE, thermal growth, or electron evaporation, or other methods.

In this embodiment, the first dielectric layer 150 can passivate the surface of the semiconductor device, decease or eliminate the current collapse effect of the GaN semiconductor device, for example, decease or eliminate the current collapse effect of the GaN high electron mobility transistor, and protect the surface of the semiconductor device against the external influence, and the like.

It is to be noted that, in the present invention, the first dielectric layer 150 is optionally an integral film layer which, after the formation of the gate electrode 121, the source electrode 122 and the drain electrode 123 of the semiconductor device, is formed at a side of the multi-layer semiconductor layer 110 of the semiconductor device facing the heat dissipation layer 140. Specifically, the first dielectric layer 150 covers the gate electrode 121 and is formed on the multi-layer semiconductor layer 110 between the source electrode 122 and the gate electrode 121 and between the gate electrode 121 and the drain electrode 123. In the present invention, the first dielectric layer 150 can even extend to the passive area 130 from the active area 120 of the semiconductor device. It can be understood by those skilled in the art that the structure of the first dielectric layer 150 is not specifically limited in the present invention.

In a first embodiment shown in FIG. 1B, the gate electrode 121 is shown as a T-shaped gate electrode. That is, the gate electrode 121 comprises a protrusion portion which protrudes downward. In this case, "the first dielectric layer 150 is located between the source electrode 122 and the gate electrode 121" means that the first dielectric layer 150 is located between the source electrode 122 and the protrusion portion of the gate electrode 121. Similarly, "the first dielectric layer 150 is located between the gate electrode 121 and the drain electrode 123" means that the first dielectric layer 150 is located between the protrusion portion of the gate electrode 121 and the drain electrode 123.

Exemplarily, based on the above technical solutions, the semiconductor device further comprises a second dielectric layer 160 which is located between the first dielectric layer 150 and the heat dissipation layer 140 and covers the gate electrode 121.

In this embodiment, optionally, the second dielectric layer 160 is made of SiN. Optionally, the second dielectric layer 160 is formed by MOCVD. However, in the present invention, the material of the second dielectric layer 160 is not limited, and the method for forming the second dielectric layer 160 is not limited either. For example, the second dielectric layer 160 can be formed by PECVD, ALD, MBE, thermal growth, or electron evaporation, or other methods.

In this embodiment, the first dielectric layer 150 is formed at least on the multi-layer semiconductor layer 110 between the gate electrode 121 and the source electrode 122 and between the gate electrode 121 and the drain electrode 123, the second dielectric layer 160 is formed on the first dielectric layer 150 and the metal of the gate electrode 121, and the heat dissipation layer 140 is formed on the second dielectric layer 160 and extends to the passive area 130. The close arrangement of the second dielectric layer 160 to the gate electrode 121 within the active area 120 improves the passivation effect. Thus, the current collapse effect can be decreased, and the electrical performance of the semiconductor device can be further improved.

It is noted that, in the present invention, the second dielectric layer 160 can also extend onto the source electrode 122 and/or the drain electrode 123 in the active area 120, and in the present invention, the second dielectric layer 160 can even extend to the passive area 130 of the semiconductor device. It can be understood by those skilled in the art that the structure of the second dielectric layer 160 is not specifically limited in the present invention.

It is to be noted that, if the first dielectric layer 150 and the second dielectric layer 160 extend into the passive area 130, it is necessary to pattern and etch the heat dissipation layer 140, the second dielectric layer 160 and the first dielectric layer 150 on the source electrode pads 132 in the passive area 130 to form windows (not shown) in the source electrode pads 132, by which the source electrode pads 132 within the passive area 130 are electrically connected to other devices. Similarly, windows are formed in the gate electrode pads 131 within the passive area 130, by which the gate electrode pads 131 are electrically connected to other devices; and windows are formed in the drain electrode pads 133 within the passive area 130, by which the drain electrode pads 133 are electrically connected to other devices. Specifically, the heat dissipation layer 140 and the dielectric layers within the passive area 130 are patterned by photolithographing and oxygen plasma etching processes, to leave behind the windows by which the leads are then conveniently and correspondingly connected to the source electrode pads 132, the drain electrode pads 133 and the gate electrode pads 131 within the passive area 130.

Exemplarily, based on the above technical solutions, optionally, this multi-layer semiconductor layer 110 comprises a buffer layer 111 located on the substrate 100 and a barrier layer 112 located on the buffer layer 111. The barrier layer 112 and the buffer layer 111 form a heterojunction structure, and the source electrode 122, the drain electrode 123 and the gate electrode 121 within the active area 120 are all located on the surface of the barrier layer 112.

In this embodiment, the multi-layer semiconductor layer 110 is optionally made of a III-V compound semiconductor material. In this embodiment, the barrier layer 112 and the buffer layer 111 form a heterojunction structure, with 2DEG (indicated by a dashed line in FIG. 1B) being formed at the interface of the heterojunction. The barrier layer 112 is optionally made of any semiconductor material which can form a heterojunction with the buffer layer 111, for example, Ga compound semiconductor material or III nitride semiconductor material, for example, $In_xAl_yGa_zN_{1-x-y-z}$ ($0 \le x, y, z \le 1$). However, the material of the semiconductor layer of the multi-layer semiconductor layer 110 is not specifically limited in the present invention.

Figure 1C:
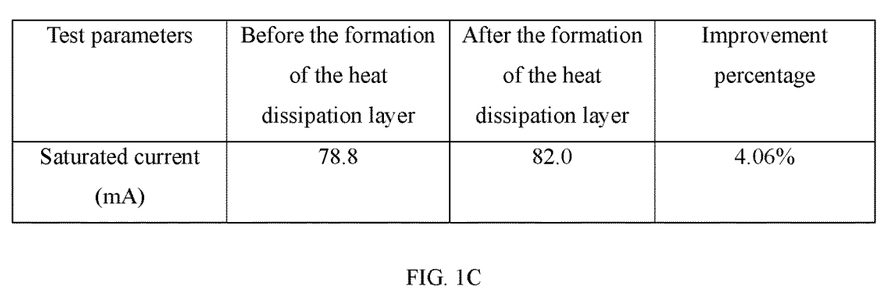
FIG. 1C is a comparison diagram of the saturated current of the semiconductor device before and after the formation of a heat dissipation layer.
Figure 1D:
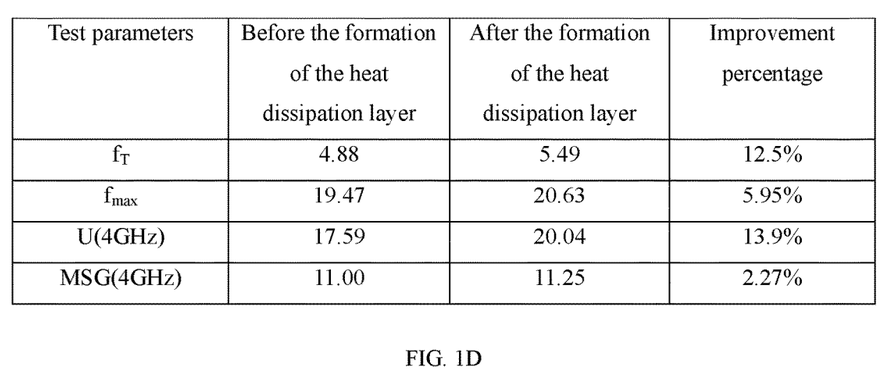
FIG. 1D is a comparison diagram of the RF characteristics of the semiconductor device before and after the formation of a heat dissipation layer.

The inventors have conducted experiments based on the above technical solutions to prove the helpfulness of the heat dissipation layer for the DC characteristics and RF characteristics of the semiconductor device. During the experiments, a semiconductor device having a heat dissipation layer made of three-layer boron nitride material is used. The DC characteristics and RF characteristics of the semiconductor device are tested respectively before and after the formation of the heat dissipation layer. The comparison of result in the DC characteristics is shown in FIG. 1C. The saturated current of the semiconductor device after the formation of the heat dissipation layer is increased by 4%, when compared with the test result before the formation of the heat dissipation layer. It is indicated that the heat dissipation layer effectively improves the heat dissipation effect of the semiconductor device and reduces the power consumption, so that the saturated current is increased. The comparison of result in the RF characteristics is shown in FIG. 1D. After the formation of the heat dissipation layer, the cut-off frequency $f_T$ of the semiconductor device is increased by 12% when compared with the test result before the formation of the heat dissipation layer, the maximum oscillation frequency $f_{max}$ is increased by 5.95%, the unilateral power gain U (4 GHz) is increased by 13.9%, and the maximum stable gain MSG (4 GHz) is increased by 2.27%. It is indicated that the heat dissipation layer effectively dissipates heat in the semiconductor device, improves the carrier velocity, increases the transconductance, and thus increases the $f_T$, $f_{max}$, U and MSG of the semiconductor device.

The above results of DC and RF experiments show that the heat dissipation layer improves the overall heat dissipation effect of the semiconductor device and decreases the temperature inside the semiconductor device. Thus, the distribution of the heat field inside the semiconductor device becomes more uniform, and the heat dissipation efficiency and reliability of the semiconductor device are improved.

Figure 2:
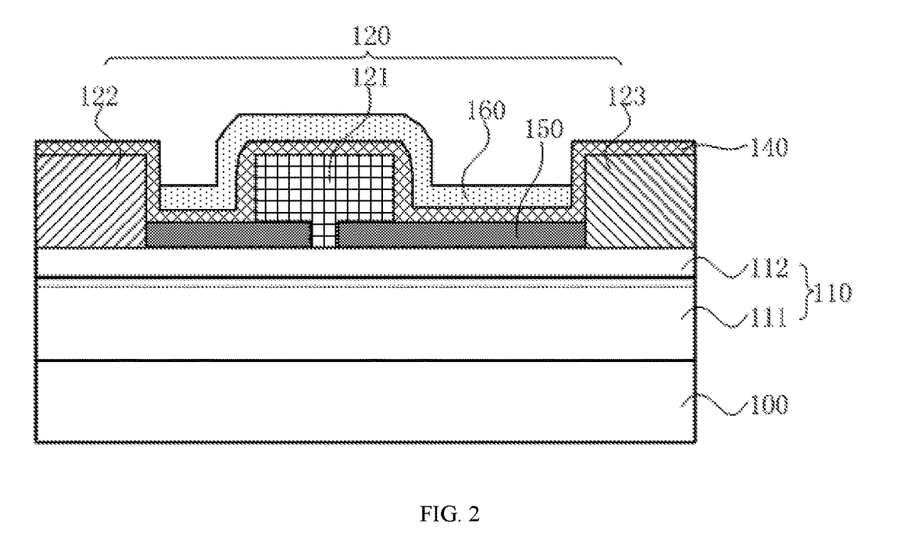
FIG. 2 is a schematic view of a semiconductor device according to a second embodiment of the present invention.

FIG. 2 is a schematic view of a semiconductor device according to a second embodiment of the present invention. The difference from the semiconductor device shown in the above embodiment lies in that the second dielectric layer 160 of the semiconductor device is located at a side of the heat dissipation layer 140 away from the first dielectric layer 150. In this embodiment, the heat dissipation layer 140 is arranged closer to the heat sources of the semiconductor device, i.e., closer to the active area of the semiconductor device. Parts in this embodiment which are the same as those in the above embodiment will not be repeated herein.

Specifically, the heat sources of the semiconductor device are located in a space between the gate electrode 121 and the drain electrode 123 and in a space between the gate electrode 121 and the source electrode 122 in the active area. In this embodiment, the heat dissipation layer 140 is located on the first dielectric layer 150 so that the heat dissipation layer 140 is close to the space between the gate electrode 121 and the drain electrode 123 and the space between the gate electrode 121 and the source electrode 122 in the active area. Thus, the heat dissipation layer 140 can dissipate heat generated by the heat sources of the semiconductor device quickly.

In the semiconductor device provided in this embodiment, by providing a heat dissipation layer 140 covering the multi-layer semiconductor layer 110 between the first dielectric layer 150 and the second dielectric layer 160, the heat dissipation layer 140 is closer to the heat sources of the semiconductor device. The heat dissipation layer 140, as an added heat dissipation approach in the planar direction, facilitates the dissipation of heat within the semiconductor device from the active area to the outside of the semiconductor device. The arrangement of this heat dissipation layer 140 facilitates the heat dissipation of the semiconductor device and improves the overall heat dissipation effect of the semiconductor device. Thus, the temperature inside the semiconductor device is decreased, and the reliability of the semiconductor device is improved.

Based on any of the above embodiments, the third embodiment of the present invention further provides a semiconductor device. This semiconductor device further comprises at least one first through hole which is located at a side of the source electrode away from the heat dissipation layer, successively penetrates through the multi-layer semiconductor layer and the substrate, and is filled with a heat dissipation material, so that the first through hole can further dissipate the heat generated in the active area.

Figure 3:
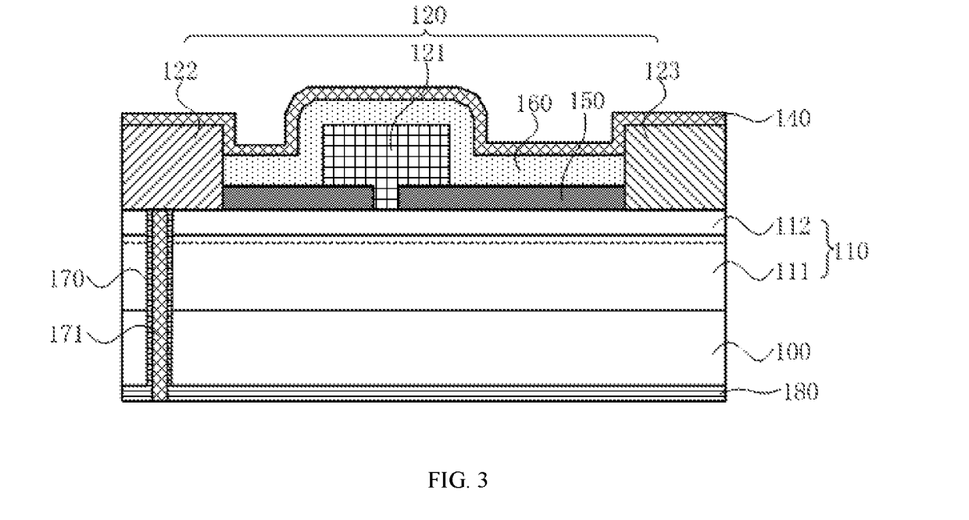
FIG. 3 is a schematic view of a semiconductor device according to a third embodiment of the present invention.

Based on the semiconductor device shown in FIG. 1B, FIG. 3 shows a semiconductor device according to the third embodiment of the present invention. This semiconductor device comprises a heat dissipation layer 140 and a first through hole 170. The first through hole 170 is located at a side of the source electrode 122 away from the heat dissipation layer 140, successively penetrates through the multi-layer semiconductor layer 110 and the substrate 100, and is filled with a heat dissipation material 171. The first through hole 170 is used for further dissipating the heat generated in the active area. Parts in this embodiment which are the same as those in any of the above embodiments will not be repeated herein.

It is to be noted that the number of the first through holes 170 is not limited in the present invention. In other embodiments, optionally, only at least one first through hole 170 is provided in the semiconductor device, and no heat dissipation layer 140 is provided. The first through hole 170 is filled with the heat dissipation material 171 and used for dissipating the heat generated in the active area. The provision of only the first through hole 170 in the semiconductor device can also facilitate the heat dissipation of the semiconductor device. In conclusion, the provision of a heat dissipation layer 140 and/or at least one first through hole 170 in the semiconductor device can facilitate the heat dissipation of the semiconductor device.

Specifically, the heat sources of the semiconductor device are located in a space between the gate electrode 121 and the drain electrode 123 and in a space between the gate electrode 121 and the source electrode 122 in the active area. In this embodiment, the first through hole 170 is filled with the heat dissipation material 171 and the first through hole 170 is close to the space between the gate electrode 121 and the drain electrode 123 and the space between the gate electrode 121 and the source electrode 122 in the active area. Thus, the first through hole 170 can dissipate the heat generated by the heat sources of the semiconductor device quickly.

In the semiconductor device provided in this embodiment, by providing a heat dissipation layer 140 to add a heat dissipation approach in the planar direction and by providing at least one first through hole 170 to add a heat dissipation approach in the vertical direction, the dissipation of heat within the semiconductor device from the source electrode 122, the drain electrode 123 and the gate electrode 121 within the active area to the outside of the semiconductor device is facilitated. The arrangement of the first through hole 170 and the heat dissipation layer 140 improves the heat dissipation efficiency of the semiconductor device, decreases the temperature inside the semiconductor device, and improves the reliability of the semiconductor device.

Exemplarily, based on the above technical solutions, the heat dissipation material 171 filled in the first through hole 170 is optionally boron nitride material which has a high heat-conductivity. In this embodiment, the heat dissipation material 171 is optionally single-layer boron nitride. It can be understood by those skilled in the art that, in the present invention, the heat dissipation material 171 filled in the first through hole 170 may be optionally any one or more of bilayer boron nitride, multi-layer boron nitride or boron nitride nanosheet, or other heat dissipation material. However, the present invention is not limited thereto.

Exemplarily, based on the above technical solutions, optionally, this semiconductor device further comprises a back metal layer 180 located at a side of the substrate 100 away from the gate electrode 121, the source electrode 122 and the drain electrode 123. The first through hole 170 penetrates through the back metal layer 180, and the back metal layer 180 further extends to and covers a wall of the first through hole 170.

In this embodiment, the back metal layer 180 is optionally made of gold. However, the present invention is not limited thereto. In this embodiment, the back metal layer 180 covers a wall of the first through hole 170. The heat dissipation material 171 is filled in the hole of the first through hole 170; and the first through hole 170 dissipates the heat generated in the active area of the semiconductor device outside the semiconductor device. Thus, the heat dissipation of the semiconductor device is facilitated.

In this embodiment, by providing the heat dissipation material 171 in the first through hole 170 which, below the source electrode 122 in the active area, penetrates through the multi-layer semiconductor layer 110 and the substrate 100, the dissipation of heat outside the semiconductor device is facilitated.

Exemplarily, based on the above technical solutions, in the passive area of this semiconductor device, there are source electrode pads electrically connected to the source electrode 122 in the active area. This semiconductor device further comprises at least one second through hole which is located at a side of the source electrode pads away from the heat dissipation layer 140, successively penetrates through the multi-layer semiconductor layer 110 and the substrate 100, and is filled with a heat dissipation material. The second through hole is used for further dissipating the heat generated in the active area. In FIG. 3, the passive area and the second through hole are not shown.

The heat dissipation material filled in the second through hole may be any one or more of bilayer boron nitride, multi-layer boron nitride or boron nitride nanosheet, or other heat dissipation material. However, the present invention is not limited thereto.

It is to be noted that the number of the second through holes is not limited in the present invention. In other embodiments, optionally, at least one heat dissipation approach of the at least one second through hole, the heat dissipation layer 140 and the at least one first through hole 170 is provided in the semiconductor device. Any one added heat dissipation approach can dissipate the heat generated in the active area quickly. Thus, the heat dissipation of the semiconductor device is facilitated. The number and type of the added heat dissipation approaches are not limited in the present invention.

In the semiconductor device provided in this embodiment, by providing a heat dissipation layer 140 to add a heat dissipation approach in the planar direction and by providing at least one first through hole 170 and at least one second through hole to add a heat dissipation path in the vertical direction, the dissipation of heat within the semiconductor device from the source electrode 122, the drain electrode 123 and the gate electrode 121 within the active area to the outside of the semiconductor device is facilitated. The provision of at least one heat dissipation approach of the first through hole 170, the second through and the heat dissipation layer 140 improves the heat dissipation efficiency of the semiconductor device, decreases the temperature inside the semiconductor device, and improves the reliability of the semiconductor device.

Based on any one of the above embodiments, the fourth embodiment of the present invention further provides a semiconductor device. The difference between this semiconductor device and the semiconductor device in any one of the above embodiments lies in that no second dielectric layer is provided in this semiconductor device and the heat dissipation layer is used as the second dielectric layer.

Figure 4:
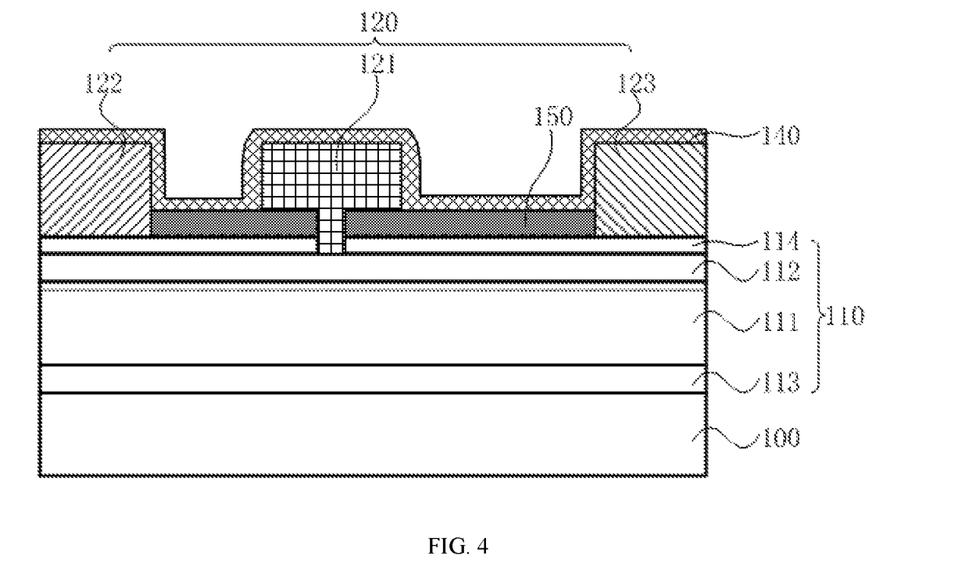
FIG. 4 is a schematic view of a semiconductor device according to a fourth embodiment of the present invention.

Based on the semiconductor device shown in FIG. 2, FIG. 4 shows a semiconductor device according to this embodiment. The heat dissipation layer 140 of this semiconductor device covers the first dielectric layer 150 and the gate electrode 121, and no second dielectric layer is provided in this semiconductor device. The heat dissipation layer 140 covers the multi-layer semiconductor layer 110 and facilitates the heat dissipation of the semiconductor device. Here, the heat dissipation layer 140 is also used as the second dielectric layer in any one of the above embodiments. Parts in this embodiment which are the same as those in any of the above embodiments will not be repeated herein.

Optionally, the heat dissipation layer 140 is made of any one or more of single-layer boron nitride, bilayer boron nitride, multi-layer boron nitride and boron nitride nanosheet. In other embodiments, optionally, the heat dissipation layer 140 is made of any other insulating material having a heat dissipation function. The material of the heat dissipation layer 140 is not specifically limited in the present invention.

In this embodiment, the heat dissipation layer 140 is made of boron nitride which is insulant but has a heat dissipation function. The heat dissipation layer 140 is arranged close to the gate electrode 121 between the gate electrode 121 and the drain electrode 123 within the active area. Thus, the heat dissipation layer 140 can be used as an insulating dielectric layer for improving the passivation effect to decrease the current collapse effect of the semiconductor device, while improving the heat dissipation effect of the semiconductor device. Thus, the characteristics of the semiconductor device are improved.

It is to be noted that, based on any one of the above embodiments, optionally, the multi-layer semiconductor layer 110 further comprises a nucleation layer 113 located between the substrate 100 and the buffer layer 111 and/or a capping layer 114 located at a side of the barrier layer 112 facing the gate electrode 121, the source electrode 122 and the drain electrode 123. The source electrode 122, the drain electrode 123 and the gate electrode 121 in the active area 120 are all located on the surface of the capping layer 114. Here, the nucleation layer 113 and the capping layer 114 are exampled in the semiconductor device shown in FIG. 4.

It can be understood by those skilled in the art that, in the present invention, from the prospect of the structural design of the semiconductor device, a heat dissipation approach is added to improve the heat dissipation effect of the semiconductor device. Thus, the semiconductor device in the present invention may be, but is not limited to, a high-power GaN high electron mobility transistor which operates in high-voltage and high-current environments, a Si-on-insulator transistor, a GaAs-based transistor, a metal-oxide-semiconductor field-effect transistor, a metal-insulator-semiconductor field-effect transistor, a double-heterojunction field-effect transistor, a junction field-effect transistor, a metal-semiconductor field-effect transistor, a metal-insulator-semiconductor heterojunction field-effect transistor.

It will be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A semiconductor device, comprising:
   a substrate;
   a multi-layer semiconductor layer located on the substrate, the multi-layer semiconductor layer being divided into an active area and a passive area outside the active area;
   a gate electrode, a source electrode and a drain electrode all located on the multi-layer semiconductor layer and within the active area;
   a heat dissipation layer covering at least one portion of the active area and containing a first heat dissipation material which comprises three-layer boron nitride;
   a first through hole provided at a side away from the heat dissipation layer, wherein the first through hole penetrates through the multi-layer semiconductor layer, and the first through hole, of which a wall is covered by a metal layer, is filled with material containing a second heat dissipation material which comprises boron nitride;

a first dielectric layer located at a side of the multi-layer semiconductor layer facing the heat dissipation layer, the first dielectric layer being formed at least on the multi-layer semiconductor layer between the gate electrode and the source electrode and between the gate electrode and the drain electrode; and a second dielectric layer which is located between the first dielectric layer and the heat dissipation layer and covers the gate electrode.

2. The semiconductor device according to claim 1, wherein the heat dissipation layer covers the gate electrode.

3. The semiconductor device according to claim 2, wherein the heat dissipation layer further covers the source electrode and the drain electrode.

4. The semiconductor device according to claim 1, wherein the heat dissipation layer covers entirety of the active area.

5. The semiconductor device according to claim 1, wherein the heat dissipation layer further extends to the passive area.

6. The semiconductor device according to claim 1, further comprising:

a first dielectric layer located at a side of the multi-layer semiconductor layer facing the heat dissipation layer, the first dielectric layer being formed at least on the multi-layer semiconductor layer between the gate electrode and the source electrode and between the gate electrode and the drain electrode.

7. The semiconductor device according to claim 6, wherein the first dielectric layer further extends to the passive area.

8. The semiconductor device according to claim 1, wherein the first through hole is located at a side of the source electrode away from the heat dissipation layer.

9. The semiconductor device according to claim 8, further comprising:

a back metal layer located at a side of the substrate away from the multi-layer semiconductor layer.

10. The semiconductor device according to claim 9, wherein the first through hole penetrates through the back metal layer, and the back metal layer covers a wall of the first through hole.

11. The semiconductor device according to claim 1, further comprising:

a source electrode pad located within the passive area and electrically connected to the source electrode; and a second through hole which is located at a side of the source electrode pad away from the heat dissipation layer, penetrates through the multi-layer semiconductor layer and the substrate, and is filled with a third heat dissipation material.

12. The semiconductor device according to claim 11, wherein the third heat dissipation material comprises boron nitride.

13. The semiconductor device according to claim 1, wherein the multi-layer semiconductor layer comprises:

a buffer layer located on the substrate; and a barrier layer located on the buffer layer, wherein the barrier layer and the buffer layer form a heterojunction structure, and the source electrode, the drain electrode and the gate electrode are all located on a surface of the barrier layer.

14. The semiconductor device according to claim 13, further comprising a nucleation layer located between the substrate and the buffer layer.

15. The semiconductor device according to claim 13, further comprising a capping layer located at a side of the barrier layer away from the substrate.

\* \* \* \* \*